US011738422B2

(12) United States Patent
Sekiya (10) Patent No.: US 11,738,422 B2
(45) Date of Patent: Aug. 29, 2023

(54) MANAGEMENT METHOD OF MACHINING SYSTEM

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 152 days.

(21) Appl. No.: 17/224,328

(22) Filed: Apr. 7, 2021

(65) Prior Publication Data

US 2021/0339358 A1 Nov. 4, 2021

(30) Foreign Application Priority Data

Apr. 30, 2020 (JP) ................................ 2020-079975

(51) Int. Cl.
| | |
|---|---|
| *B24B 49/12* | (2006.01) |
| *B24B 41/00* | (2006.01) |
| *H01L 21/67* | (2006.01) |
| *H01L 21/304* | (2006.01) |
| *B24B 7/22* | (2006.01) |

(52) U.S. Cl.
CPC .............. *B24B 49/12* (2013.01); *B24B 7/228* (2013.01); *B24B 41/005* (2013.01); *H01L 21/304* (2013.01); *H01L 21/67253* (2013.01)

(58) Field of Classification Search
CPC ....... B24B 49/12; B24B 7/228; B24B 41/005; B24B 37/005; B24B 37/013; B24B 37/04; B24B 37/042; B24B 37/046; B24B 37/07; B24B 37/10; B24B 37/105; B24B 37/107; B24B 37/30; B24B 37/34; B24B 27/0069; B24B 51/00; H01L 21/304; H01L 21/67253; H01L 21/67276; H01L 21/67282; H01L 21/78; G05B 19/4155

USPC ................................................................. 451/6
See application file for complete search history.

(56) References Cited

U.S. PATENT DOCUMENTS

| | | | | |
|---|---|---|---|---|
| 2006/0217037 | A1* | 9/2006 | Kalanovic | ............... B24B 51/00 451/5 |
| 2019/0061093 | A1* | 2/2019 | Sekiya | ................ B24B 27/0608 |
| 2019/0076986 | A1* | 3/2019 | Shigematsu | ............. H04N 5/33 |
| 2021/0138655 | A1* | 5/2021 | Mousavian | ............ B25J 9/1612 |

FOREIGN PATENT DOCUMENTS

| | | | |
|---|---|---|---|
| JP | 2013158880 A | * | 8/2013 |
| JP | 2019054056 A | | 4/2019 |

* cited by examiner

*Primary Examiner* — Joel D Crandall
*Assistant Examiner* — Michael A Gump
(74) *Attorney, Agent, or Firm* — GREER BURNS & CRAIN, LTD.

(57) ABSTRACT

A management method of a machining system includes a chuck table, a machining unit, a transfer unit that transfers a wafer onto the chuck table, a camera unit that acquires an image containing a pattern formed on a side of a front surface of the wafer, and an information recording section. The management method is applied when the pattern is recorded in association with machining conditions in the information recording section; and records in the information recording section new machining conditions to be used when machining a new type of wafer, causes an automatic machining program, which automatically machines the new type of wafer, to start, forms an image, which contains a new pattern of the new type of wafer, by the camera unit, and records the new pattern in association with the new machining conditions in the information recording section.

10 Claims, 5 Drawing Sheets

MANAGEMENT METHOD OF MACHINING SYSTEM

BACKGROUND OF THE INVENTION

Field of the Invention

The present invention relates to a management method of a machining system in which a series of steps ranging from successively unloading a plurality of wafers from a cassette with the wafers held therein, machining them and housing them back in the cassette is performed based on an automatic machining program. The management method includes recording an image, which contains a pattern on a side of a front surface of a new type of wafer, in association with new machining conditions to be used when machining the new type of wafer.

Description of the Related Art

In a fabrication process of device chips for use in electronic equipment such as mobile phones or computers, a plurality of devices such as integrated circuits (ICs) or large scale integrations (LSIs) is first formed on a front surface of a wafer made of a semiconductor. Next, the wafer is ground from a side of its back surface to thin it to a predetermined thickness, polished on the side of the back surface, and divided from one device to another to form individual device chips. Machining of the wafer, such as grinding, polishing, and dividing, is performed by various machining systems, each of which includes a chuck table that holds the wafer and a machining unit that machines the wafer held on the chuck table. Before being loaded on each machining system, wafers are housed in a cassette. In a control unit for the machining system, an automatic machining program is recorded to perform a series of steps ranging from successively unloading the wafers held in the cassette and machining the wafers until returning the wafers back to the cassette.

Proper machining conditions differ depending on the type or the like of a wafer or device chips to be formed. Plural kinds of machining conditions are therefore recorded beforehand in the control unit. When the automatic machining program is started, proper one kind of machining conditions is read, and machining is performed in accordance with the machining conditions so read. If machining conditions are not proper or if a wafer other than the intended type is loaded onto the machining system, for example, machining cannot be performed appropriately. If this is the case, the machining not only fails to obtain desired machining results but also may cause damage to the wafer and the machining system, thereby raising another problem. It is hence contemplated to incorporate, in a machining system, a function that determines whether a loaded wafer is an object of machining under preset machining conditions. For example, it may be contemplated to image, with a camera unit, a wafer loaded onto a machining system, and to detect a shape (key pattern) characteristic to a member making up devices formed on the side of a front surface of the wafer or a code, such as a two-dimensional code or a bar code, applied to the wafer. Based on the detection result, the type of the wafer is discriminated, followed by a determination as to whether the wafer is an object of machining under preset machining conditions (see JP 2019-54056 A).

SUMMARY OF THE INVENTION

When a new type of wafer which has not been machined yet on a machining system is to be machined for the first time, there is a need to record new machining conditions beforehand in a control unit of the machining system. Here, a need arises for imaging the new type of wafer by a camera unit, so that a pattern is acquired for use in a determination and is recorded in association with the new machining conditions. After loading of a cassette with the wafer held therein, the machining system is therefore required to once unload the wafer from the cassette before a start of an automatic machining program, so that the wafer can be imaged by the camera unit. After returning the wafer to the cassette subsequent to the imaging, the automatic machining program has to then be started. Since the loading and unloading of the wafer are repeated at this time, lots of time are required until machining is started. Moreover, an operator of the machining system has to command the start of the automatic machining program to the control unit after recording the machining conditions in the control unit. Accordingly, a great deal of labor and time is required when machining a new type of wafers.

The present invention therefore has as an object thereof the provision of a management method of a machining system, which can automatically perform from recording of a pattern in association with machining conditions to machining of a new type of wafer when staring starting the machining of the new type of wafer.

In accordance with an aspect of the present invention, there is provided a management method of a machining system. The machining system includes a chuck table that has a holding surface on a top wall thereof and holds a wafer with a front surface thereof facing the holding surface, a machining unit that machines the wafer held on the chuck table, from a side of a back surface thereof, a transfer unit that unloads the wafer from a first cassette housing the wafer therein and mounted in a cassette mounting region where the first cassette is mounted, a camera unit that images the wafer to acquire an image containing a pattern formed on a side of the front surface of the wafer, an information recording section that records the pattern contained in the image, in association with machining conditions to be used when machining the wafer by the machining unit, and a determination section that determines another wafer that has been unloaded from the first cassette and has not been machined yet, to be a wafer as an object of machining based on a detection of a pattern same as the pattern recorded in association with the machining conditions in the information recording section, from the another wafer that has not been machined yet. The management method, when recording the pattern in association with the machining conditions in the information recording section, includes: a machining conditions recording step of recording, in the information recording section, new machining conditions to be used when machining a new type of wafer; an automatic machining program starting step of, after a second cassette with the new type of wafer housed therein is mounted in the cassette mounting region, causing the machining system to start an automatic machining program that transfers the new type of wafer from the second cassette onto the chuck table by the transfer unit, machines the new type of wafer by the machining unit under the new machining conditions recorded in the machining conditions recording step, and unloads the new type of wafer from the chuck table by the transfer unit; an imaging step of forming an image containing a new pattern of the new type of wafer by the camera unit in a course that, based on the automatic machining program, the transfer unit transfers the new type of wafer from the second cassette onto the chuck table and the chuck table holds the new type of wafer; and a pattern recording step of recording, in the information recording section, the new pattern contained in the new image formed in the imaging step, in association with the new machining conditions recorded in the machining conditions recording step.

Preferably, the new type of wafer includes a protective member bonded to the side of the front surface thereof, the camera unit has an infrared camera, and in the imaging step, the new type of wafer is held on the chuck table via the protective member, and the camera unit images the side of the front surface of the new type of wafer from the side of the back surface thereof.

Also preferably, the determination section further has a function that determines existence/non-existence and properness/improperness of the protective member bonded to the side of the front surface of the new type of wafer that has not been machined yet, based on information about the protective member recorded in association with the new machining conditions in the information recording section and does not cause the machining unit to machine the new type of wafer that has not been machined yet, if the protective member is determined to be improper or if the protective member is determined not to be bonded to the new type of wafer that has not been machined yet, and in the pattern recording step, the information about the protective member is extracted from the new image formed in the imaging step and is recorded in association with the new machining conditions in the information recording section.

In the management method according to the above-described aspect of the present invention for the machining system, the automatic machining program is started after recording, in the information recording section, the new machining conditions to be used when machining the new type of wafer. In the course of the transfer of the new type of wafer from the second cassette onto the chuck table by the transfer unit until its holding on the chuck table, the wafer is imaged on the side of its front surface by the camera unit. Then, the image that contains the pattern formed on the front surface of the wafer is formed by the camera unit, and the pattern contained in the image is recorded in association with the new machining conditions in the information recording section. In the machining system, the individual elements are subsequently controlled in accordance with the automatic machining program, so that the wafer is machined under the new machining conditions. It is therefore unnecessary to once return the wafer to the second cassette after recording the pattern in association with the new machining conditions. In other words, the operator of the machining system can record the pattern in association with the new machining conditions by simply starting the automatic machining program after recording the new machining conditions in the information recording section, and the machining of the wafer can then be performed automatically. As a consequence, the machining of the new type of wafer can be started promptly.

According to the above-described aspect of the present invention, there is hence provided a management method of a machining system, which can automatically perform from recording of a pattern in association with machining conditions until machining of a new type of wafer when staring starting the machining of the new type of wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 2:
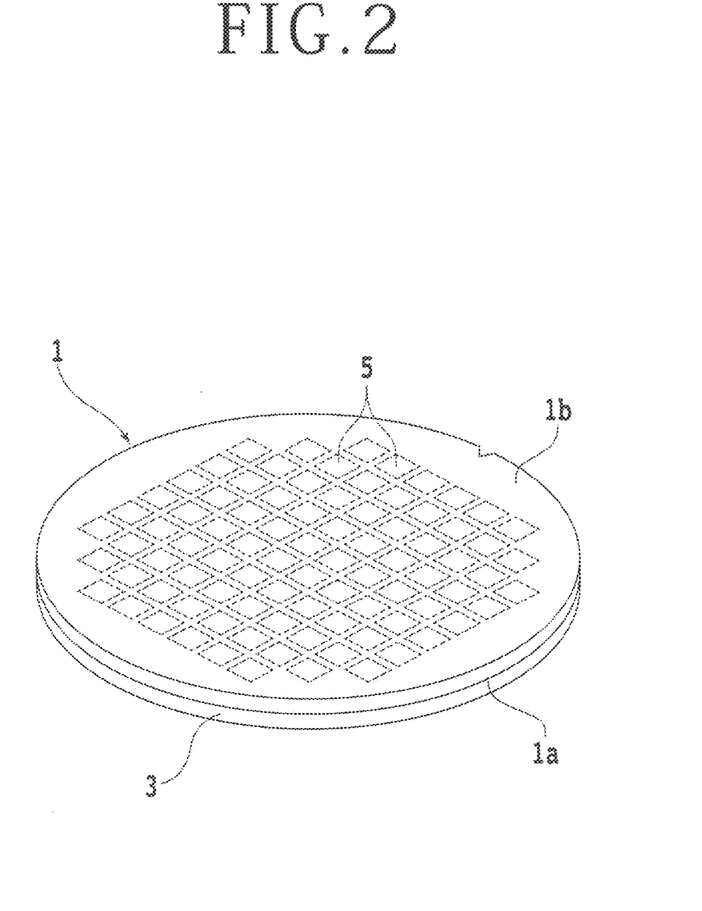
FIG. 2 is a perspective view schematically depicting a wafer.

With reference to the attached drawings, a description will be made about an embodiment of the present invention. A machining system to be managed by a management method according to this embodiment is useful in machining wafers made, for example, from a semiconductor material such as silicon or silicon carbide (SiC). FIG. 2 is a perspective view schematically depicting a side of a back surface $1b$ of a wafer 1. In FIG. 2, features that are not visible directly from an outside are indicated by broken lines.

On a front surface $1a$ of the wafer 1, a plurality of intersecting dicing lines (hereinafter called "streets") is set. In individual regions defined by the streets, a plurality of devices 5 such as ICs or LSIs is formed. On the front surface $1a$ of the wafer 1, interconnection layers, electrodes, and the like (not depicted) which contribute to inputs and outputs of electrical signals into and from the devices 5 are formed. When the wafer 1 is divided along the streets, individual device chips can be formed. If before dividing the wafer 1, the wafer 1 is beforehand ground and thinned from the side of the back surface $1b$ and polished on the side of the back surface $1b$, thin device chips can be formed when the wafer 1 is divided. If the wafer is to be ground and polished, a tape-shaped protective member 3 is arranged on the front surface $1a$ of the wafer 1 to protect the devices 5 and the like formed on the side of the front surface $1a$.

The protective member 3 includes a base material (not depicted) formed, for example, from an epoxy resin, an acrylic resin, a synthetic rubber, or a polyimide, and an adhesive layer (not depicted) on the base material. The adhesive layer may preferably contain, for example, a UV-curable resin, so that a strong adhesive force is produced to the wafer 1 but, upon irradiation of an ultraviolet ray (ultraviolet light), the UV-curable resin is cured and the adhesive force is lowered. Therefore, when desired to peel off the protective member 3 bonded to the wafer 1, an ultraviolet ray is irradiated to the protective member 3 to lower the adhesive force of the adhesive layer.

Figure 1:
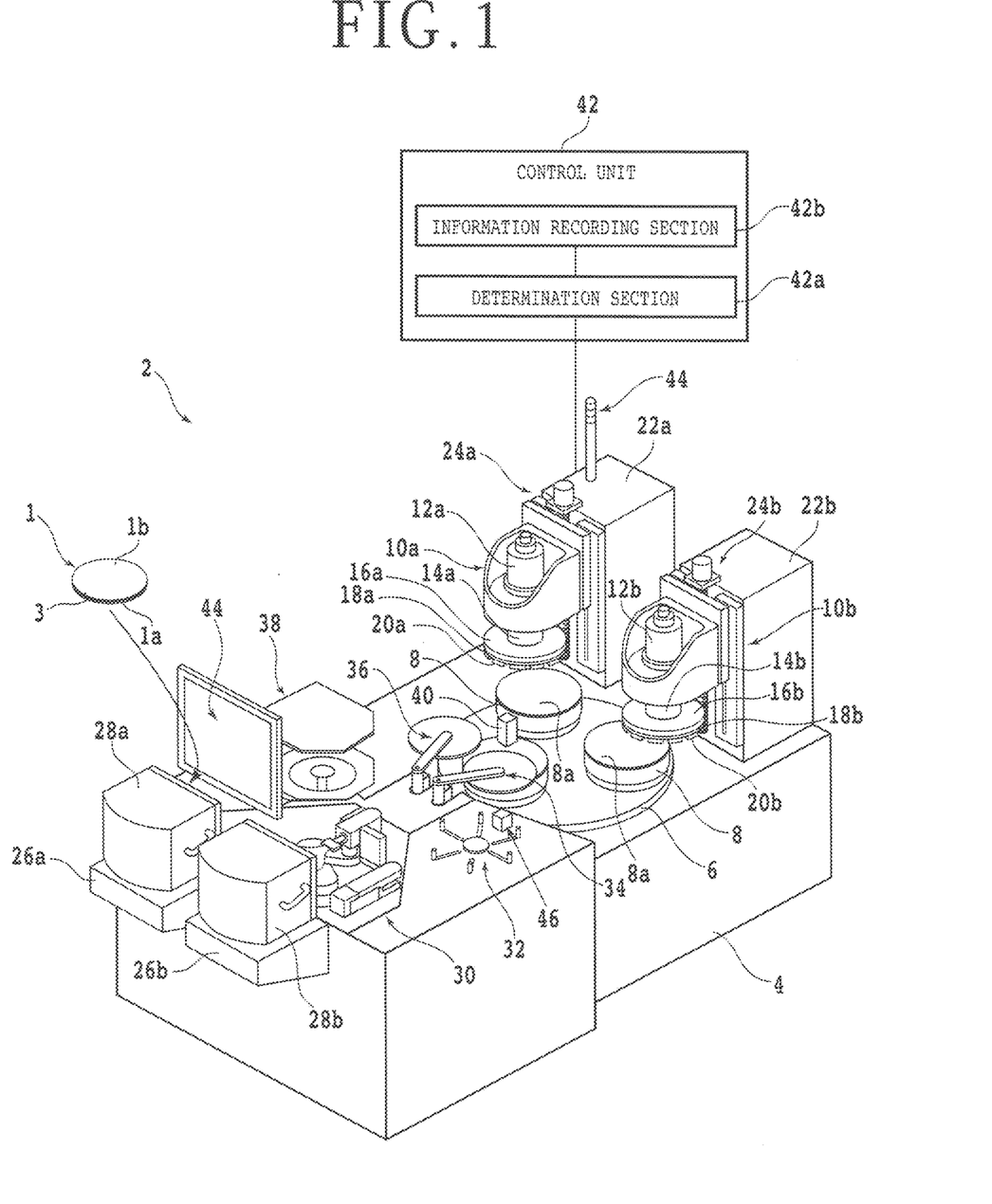
FIG. 1 is a perspective view schematically depicting a configuration of a machining system.

The machining system, which is managed by the management method according to this embodiment, is, for example, a grinding or polishing system that grinds or polishes the wafer 1 from the side of the back surface $1b$. A description will hereinafter be made taking a grinding system as an example of the machining system, although the machining system is not limited to the grinding system. FIG. 1 is a perspective view schematically depicting a machining system 2.

The machining system (grinding system) 2 will next be described in detail. On a bed 4, a disc-shaped turn table 6 is disposed rotatably in a horizontal plane. On a top wall of the turn table 6, three chuck tables 8 are arranged with intervals of 120 degrees in a peripheral direction, so that rotation of the turn table 6 positions the individual chuck tables 8 in a wafer loading/unloading region, a coarse grinding region, and a finish grinding region, respectively. In the wafer loading/unloading region, the wafer 1 that has not been machined yet (which may hereinafter be also called "the wafer 1 to be machined" or "the to-be-machined wafer 1") is placed on the chuck table 8, and after machining, the wafer 1 is separated from the chuck table 8. In the coarse grinding region, coarse grinding is performed using a machining unit (grinding unit) 10*a* to grind the wafer 1 at a high machining feed speed. In the finish grinding region, finish grinding is performed using a machining unit (grinding unit) 10*b*, so that the ground surface is provided with higher planarity after the finish grinding than after the coarse grinding.

The chuck table 8 internally has a suction channel (not depicted), which is connected at one end thereof to a suction source (not depicted) and at another end thereof to a holding surface 8*a* of a top wall of the chuck table 8. The holding surface 8*a* is formed of a porous member and can hold the wafer 1 under suction on the chuck table 8 when a negative pressure produced by the suction source is caused to act on the wafer 1 placed on the holding surface 8*a* via the porous member.

On a rear part of the bed 4, columns 22*a* and 22*b* are disposed upright, and the machining units 10*a* and 10*b* are disposed on the columns 22*a* and 22*b*, respectively. The machining units 10*a* and 10*b* are connected at upper ends thereof to spindle motors 12*a* and 12*b*, respectively, and include spindles 14*a* and 14*b* that are rotationally driven by the respective spindle motors 12*a* and 12*b* and extend along a vertical direction. On lower ends of the respective spindles 14*a* and 14*b*, wheel mounts 16*a* and 16*b* are arranged. On lower surfaces of the respective wheel mounts 16*a* and 16*b*, grinding wheels 18*a* and 18*b* are secured. The grinding wheels 18*a* and 18*b* include on lower surfaces thereof two sets of grinding stones 20*a* and 20*b*, which are each disposed in an annular shape, so that the wafer 1 held on the chuck table 8 is sequentially ground by the two sets of grinding stones 20*a* and 20*b*. The machining units 10*a* and 10*b* are configured to be moved up and down by machining feed units 24*a* and 24*b*, respectively.

A front-side part of the bed 4 is higher than a part where the turn table 6 is disposed, and on a front end of the bed 4, cassette mounting table 26*a* and 26*b* are fixed as cassette mounting regions. For example, a cassette 28*a* with to-be-machined wafers 1 held therein is mounted on the cassette mounting table 26*a*, while a cassette 28*b* for holding wafers 1, machining of which has been ended (which may hereinafter be also called "the machined wafers 1"), is mounted on the cassette mounting table 26*b*. However, the use of the cassettes 28*a* and 28*b* is not limited to the above-exemplified use. Adjacent the cassette mounting tables 28*a* and 28*b*, a wafer transfer robot 30 is installed on the bed 4. On the front-side part of the bed 4, there are also arranged a positioning table 32 having a plurality of positioning pins, a wafer loading mechanism (loading arm) 34, a wafer unloading mechanism (unloading arm) 36, and a spin rinser dryer 38 that rinses and spin-dries the ground wafer 1.

The to-be-machined wafer 1 is unloaded by the wafer transfer robot 30 from the cassette 28*a* mounted on the cassette mounting table 26*a*. The wafer transfer robot 30 includes a plurality of arms, which are pivotally connected together at proximal end portions thereof, and at distal ends thereof, have holding portions on which the wafer 1 is placed. The cassette mounting table 26*a* is movable up and down, and moves up or down such that the height of the intended wafer 1 matches the height of the holding portions of the wafer transfer robot 30. As an alternative, the wafer transfer robot 30 may be configured to be movable up and down. The wafer transfer robot 30 then transfers the wafer 1 onto the positioning table 32. At the positioning table 32, the positioning pins are moved toward a center of the positioning table 32 in an interlocked relation with one another, and are hence allowed to hold the wafer 1 at its outer periphery, so that the position of the wafer 1 is allowed to match a predetermined position.

The wafer loading mechanism (loading arm) 34 includes, for example, a shaft portion rotatable about an inner pole member fixed on the bed 4, an arm portion extending in a horizontal direction from an upper end of the shaft portion, and a holding portion that is disposed at a distal end of the arm portion and holds the wafer 1 from above. The wafer loading mechanism 34 holds the wafer 1, the position of which has been adjusted at the positioning table 32, by the holding portion from above, and transfers it onto the chuck table 8 positioned in the wafer loading/unloading region. As described above, the wafer transfer robot 30 and the wafer loading mechanism (loading arm) 34 function as a transfer unit that unloads the wafer 1 from the cassette 28*a* and transfers the wafer 1 onto the chuck table 8.

Figure 3A:
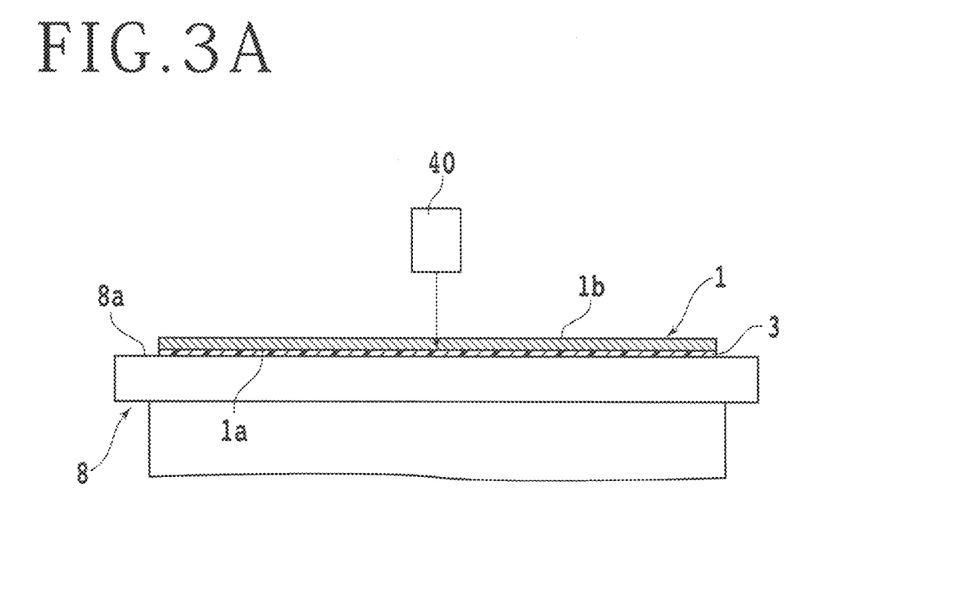
FIG. 3A is a cross-sectional view schematically illustrating an example of an imaging step.

Over the bed 4, a camera unit 40 is arranged above a route of the wafer 1 from its unloading from the cassette 28*a* mounted on the cassette mounting table (in the cassette mounting region) 26*a* to its holding on the chuck table 8. The camera unit 40 is disposed, for example, above the chuck table 8 positioned in the wafer loading/unloading region. FIG. 3A is a cross-sectional view schematically illustrating the wafer 1 that is being imaged by the camera unit 40. The camera unit 40 images the wafer 1 from the side of the back surface 1*b*, and captures light such as an infrared ray reflected back from the side of the front surface 1*a* of the wafer 1 to acquire an image containing the side of the front surface 1*a* of the wafer 1. For example, the camera unit 40 includes an infrared camera, and may further include an infrared light source. Here again, the camera unit 40 images the side of the front surface 1*a* of the wafer 1 from the side of the exposed back surface 1*b* of the wafer 1 through the wafer 1, so that an image containing features such as the devices 5 formed on the side of the front surface 1*a* of the wafer 1 can be acquired.

Figure 3B:
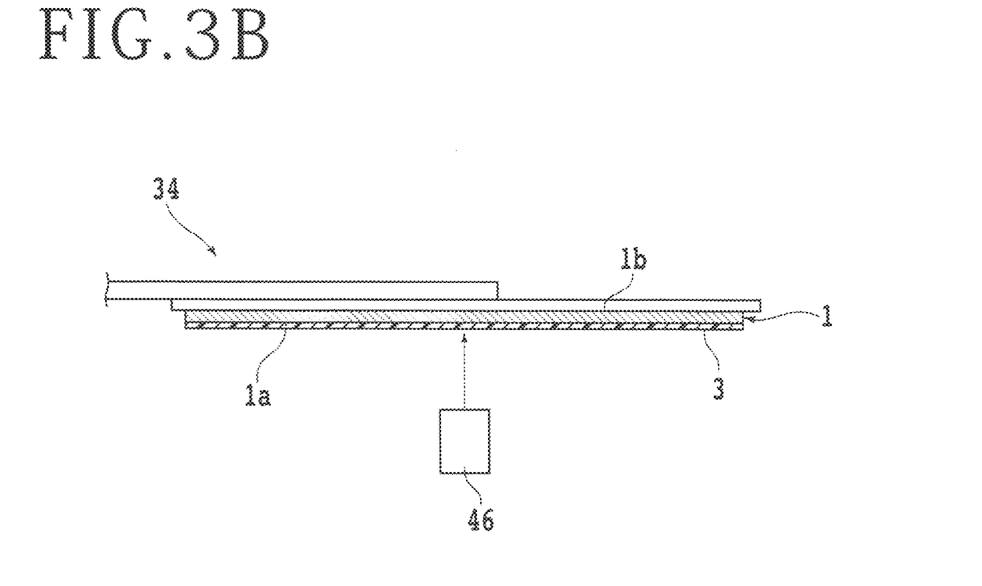
FIG. 3B is a cross-sectional view schematically illustrating another example of the imaging step.

On the bed 4, a camera unit 46 may also be arranged below the route of the wafer 1 from its unloading from the cassette 28*a* mounted on the cassette mounting table (in the cassette mounting region) 26*a* to its holding on the chuck table 8. The camera unit 46 is disposed on the bed 4, for example, between the positioning table 32 and the chuck table 8 positioned in the wafer loading/unloading region. FIG. 3B is a cross-sectional view schematically illustrating the wafer 1 that is being imaged by the camera unit 46.

The camera unit 46 has a camera that includes a charge coupled device (CCD) sensor or a complementary metal oxide semiconductor (CMOS) sensor, and may further include an illumination light source. The camera unit 46 images the wafer 1, which is in the course of its transfer by the wafer loading mechanism 34, from the side of the downwardly-exposed front surface 1*a*. If the protective member 3 is bonded to the side of the front surface 1*a* of the wafer 1, the camera unit 46 can image the protective member 3 and can also image the side of the front surface 1*a* of the wafer 1 through the protective member 3.

A description will next be made about a control unit 42 included in the machining system 2. The control unit 42 is connected to the individual elements of the machining system 2 and has functions to control the individual elements. The control unit 42 is configured by a computer that includes, for example, a processing device such as a central processing unit (CPU), a main storage device such as a dynamic random access memory (DRAM), and an auxiliary storage device such as a flash memory. By operating the processing device and the like in accordance with software stored in the auxiliary storage device, the functions of the control unit 42 are realized.

In the control unit 42, machining conditions for machining the wafer 1 as an object of machining are inputted and recorded beforehand. The control unit 42 therefore controls the individual elements in accordance with the machining conditions. The machining conditions are set as needed according to a type of each wafer 1 and each desired machining result. Optimal machining conditions vary depending on, for example, a diameter and a thickness of each wafer 1, a kind of a material of each wafer 1, and the like. The machining conditions include various setting conditions such as a finish thickness of the wafer 1 by machining, rotational speeds of the grinding wheel and a polishing pad, a rotational speed of the chuck table 8, and a machining feed speed.

In addition, the control unit 42 also has a function to determine whether the wafer 1, which has been unloaded from the cassette 28*a* mounted on the cassette mounting table (in the cassette mounting region) 26*a*, is a wafer 1 as an object of machining. In other words, the control unit 42 has a function to determine whether the wafer 1 is a wafer 1 that is proper for machining under the preset and selected machining conditions. The control unit 42 includes a determination section 42*a* that determines whether the wafer 1 as an object of determination is a wafer 1 as an object of machining, and an information recording section 42*b* in which information on a pattern (key pattern) of features such as the devices 5, which the wafer 1 should include on the side of the front surface 1*a*, is recorded. The information recording section 42*b* has a function to send the information to the determination section 42*a* when a determination is performed at the determination section 42*a*.

Figure 4:
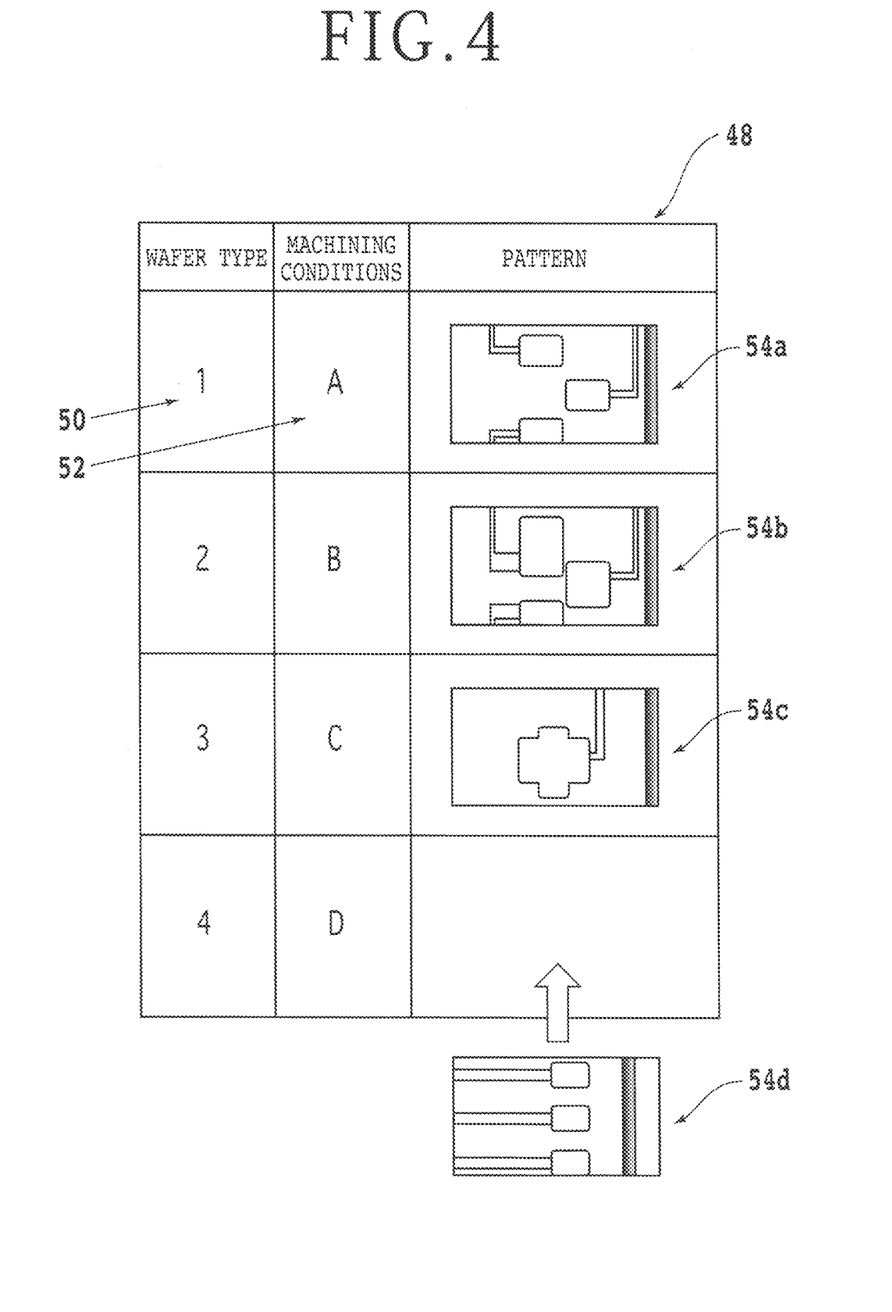
FIG. 4 is a plan view schematically illustrating patterns to be recorded in associating with corresponding kinds of machining conditions in an information recording section.

The shapes of features such as individual members, interconnections, and electrodes, which make up the devices 5 formed on the front surface 1*a* of the wafer 1, differ depending on the type of the wafer 1. The type of the wafer 1 can therefore be discriminated based on the shape (pattern) of features formed on the front surface 1*a* of the wafer 1. Therefore, the information recorded in the information recording section 42*b* is, for example, a pattern (key pattern) characteristic to individual features contained in an image acquired by causing the camera unit 40 or 46 to image the front surface 1*a* of the wafer 1. In FIG. 4, patterns 54*a*, 54*b*, 54*c*, and 54*d* to be recorded in the information recording section 42*b* are schematically illustrated. In the information recording section 42*b*, patterns of sides of front surfaces 1*a* of various types of wafers 1 are recorded beforehand in association with their machining conditions and type information of the wafers 1. When the operator of the machining system 2 selects the type of the wafer 1 as an object of machining or the machining conditions for the wafer 1, the control unit 42 controls the individual elements of the machining system 2 in accordance with the machining conditions, and the determination section 42*a* determines whether the pattern recorded in association with the machining conditions is formed on the side of the front surface 1*a* of the wafer 1.

The machining system 2 also includes a display unit such as a liquid crystal display that displays various kinds of information, alert screens, and the like, and input interfaces such as a keyboard, a mouse, or buttons that are used when inputting various commands to the control unit 42. The machining system 2 may also include a touch panel display 44 that functions as a display unit and an input interface. In this case, an image of operation buttons is displayed on the touch panel display 44, and the operator inputs a command by touching a touch panel at a display position of the image.

The determination section 42*a* receives information about the wafer 1 as the object of machining from the information recording section 42*b* when making a determination on the wafer 1 as the object of determination. The control unit 42 causes the camera unit 40 or 46 to image the wafer 1 as the object of determination, thereby acquiring an image containing the side of the front surface 1*a* of the wafer 1. The determination section 42*a* determines whether the pattern of the features, which the wafer 1 as the object of machining should include on the side of the front surface 1*a*, exists in the acquired image.

If the image of the wafer 1 as an object of machining is received as information from the information recording section 42*b*, the determination section 42*a* compares the image received from the information recording section 42*b* with the image acquired by the camera unit 40 or 46 by a method such as pattern matching. If the two images match each other, specifically if the pattern of the features, which the wafer 1 as the object of machining should include, is found in the wafer 1 as an object of determination, the determination section 42*a* determines that the wafer 1 as the object of determination is a wafer 1 as an object of machining. If the two images do not match each other, on the other hand, specifically if the pattern of the features, which the wafer 1 as the object of machining should include, is not found in the wafer 1 as the object of determination, on the other hand, the determination section 42*a* determines that the wafer 1 as the object of determination is not a wafer 1 as an object of machining. If the determination section 42*a* determines that the wafer 1 as the object of determination is a wafer 1 as an object of machining, for example, machining (grinding) by the machining units (grinding units) 10*a* and 10*b* can be performed on the wafer 1 as the object of determination. If the determination section 42*a* determines that the wafer 1 as the object of determination is not a wafer 1 as an object of machining, on the other hand, the machining system 2 does not perform machining on the wafer 1 and unloads the wafer 1, for example, to the cassette 28*a* mounted on the cassette mounting table 26*a*.

The machining system 2 includes the camera units 40 and 46 that can image the side of the front surface 1*a* of the wafer 1 as the object of determination, and the control unit 42 including the determination section 42*a* and the information recording section 42*b*. The machining system 2 can therefore appropriately machine the loaded wafer 1 under the predetermined machining conditions after finding it to be a wafer 1 as an object of machining.

In the control unit 42, the automatic machining program is incorporated to control the individual elements such that the plural wafers 1 housed in the cassette 28a are automatically machined one after another. The control unit 42 automatically machine each wafer 1 by controlling the individual elements in accordance with the automatic machining program. The operator who uses the machining system 2 mounts, for example, the cassette 28a with the same type of wafers 1 housed therein and the empty cassette 28b on the cassette mounting tables (in the cassette mounting regions) 26a and 26b, respectively, and commands the control unit 42 to start the automatic machining program.

With the automatic machining program being started, the control unit 42 causes the transfer unit (wafer transfer robot 30) to unload the wafer 1 from the cassette 28a and to transfer it to the positioning table 32. The wafer 1 is then held by the individual pins of the positioning table 32, so that the position of the wafer 1 is allowed to match the predetermined position. The transfer unit (wafer loading mechanism 34) is next controlled to transfer the wafer 1 from the positioning table 32 onto the chuck table 8 positioned in the wafer loading/unloading region. Thereafter, the wafer 1 will be machined under the predetermined machining conditions for the machining of the wafer 1. First, the wafer 1 is held under suction on the chuck table 8, and the turn table 6 is rotated clockwise to move the chuck table 8 to the coarse grinding region. Next, the chuck table 8 and the grinding wheel 18a are rotated at respective predetermined rotational speeds, the grinding wheel 18a is lowered at a predetermined feed speed to bring the grinding stones 20a into contact with the wafer 1, and the wafer 1 is then machined (coarsely ground) to a predetermined thickness. Similarly, the wafer 1 is machined (subjected to finish grinding) in the finish grinding region.

Then, the turn table 6 is rotated clockwise to position the chuck table 8 in the wafer loading/unloading region, and the chuck table 8 is caused to cancel the suction holding of the wafer 1. Next, the transfer unit (wafer unloading mechanism 36) is controlled to transfer the wafer 1 from the chuck table 8 to the spin rinser dryer 38, and the spin rinser dryer 38 is controlled to rinse the wafer 1. Finally, the wafer transfer robot 30 is controlled to transfer the wafer 1 from the spin rinser dryer 38 to the cassette 28b.

The automatic machining program is continued until the wafers 1, which are housed in the cassette 28a and have not been machined yet, are all machined, and is ended when all the wafers 1 have been housed in the cassette 28b. It is to be noted that each wafer 1 does not remain on standby after an immediately preceding wafer 1 is unloaded from the cassette 28a until it is housed in the cassette 28b. In other words, when any step is finished on a preceding wafer 1, the step is immediately performed on a succeeding wafer 1 and at the same time, the next step is performed on the preceding wafer 1.

According to the automatic machining program, the control unit 42 controls the camera unit 40 or 46 to image the side of the front surface 1a of the wafer 1 and hence to form an image in the course of its unloading from the cassette 28a until its machining. In the image, the pattern formed on the front surface 1a of the wafer 1 is contained. The determination section 42a then determines whether a specific pattern (key pattern), which has been recorded in the information recording section 42b in association with the machining conditions to be used when machining the wafer 1, exists in the image. If the specific pattern (key pattern) is found in the image as a result of the determination, the wafer 1 is determined to be a wafer 1 as an object of machining, and machining is performed. If the specific pattern is not found in the image, on the other hand, the wafer 1 is determined not to be a wafer 1 as an object of machining, and is returned to the cassette 28a without machining it. As a consequence, it is possible to prevent damage to the wafer 1, the machining system 2, and the like.

It is now assumed that machining of a new type of wafer 1, which has not been machined yet by the machining system 2, is to be started. In this case, new machining conditions must first be recorded in the information recording section 42b. For the performance of a determination by the determination section 42b, it is then necessary to record, together with the new machining conditions, the pattern (key pattern) of features, which are formed on the front surface 1a of the wafer 1 as an object of machining under the new machining conditions, in association with the new machining conditions in the information recording section 42b.

If the front surface 1a of the wafer 1 is imaged by the camera unit 40 or 46 to record a pattern in the information recording section 42b, however, it has conventionally been needed to perform imaging separately from the steps performed in accordance with the automatic machining program. Described specifically, after a cassette 28a with a new type of wafers 1 housed therein has been mounted on the cassette mounting table 26a, an operator inputs a command in the control unit 42 via an input interface to unload one of the wafers 1 from the cassette 28a. Then, the wafer 1 is brought into a face-to-face relation with the camera unit 40 or 46, the wafer 1 is imaged on the side of the front surface 1a by the camera unit 40 or 46 to acquire an image, and the image is displayed on the display unit. The operator selects a pattern, which can be used in a determination by the determination section 42a, from the image displayed on the display unit, and records the pattern in association with new machining conditions in the information recording section 42b.

Figure 5A:
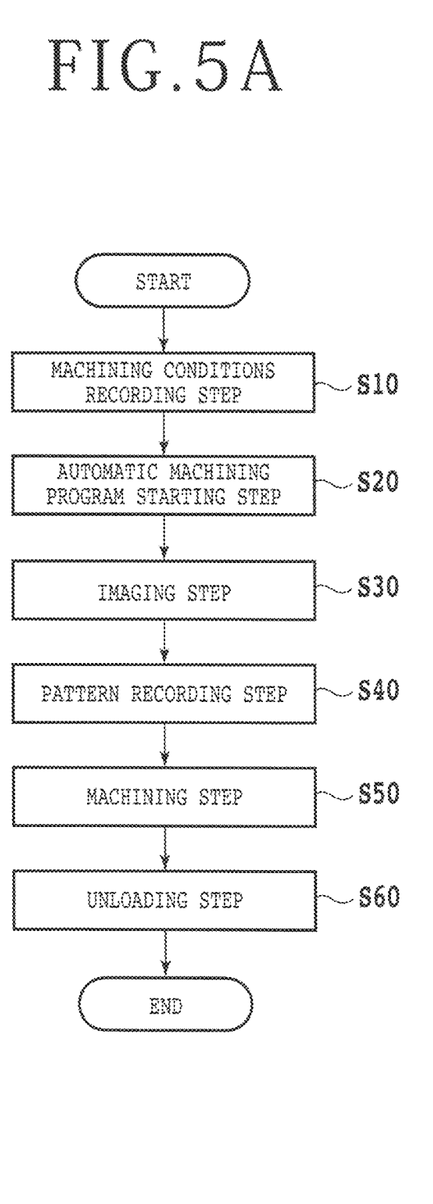
FIG. 5A is a flow chart schematically illustrating a flow of individual steps of a management method according to an embodiment of the present invention for the machining system.

As automatic machining cannot be started following the registration, the wafer 1 the imaging of which has been completed has to be now housed back in the cassette 28a. When the automatic machining program is subsequently started, the wafer 1 is unloaded again from the cassette 28a and then machined. As described above, when starting to machine a new type of wafer 1, laborious preparatory work has heretofore been indispensable including unloading the wafer 1 once from the cassette 28a and after recording the pattern, housing it back in the cassette 28a. In order to omit such laborious preparatory work, the management method according to this embodiment records a pattern in the information recording section 42b in the course of automatic machining performed based on the automatic machining program. FIG. 5A is a flow chart illustrating a flow of individual steps in the management method according to this embodiment. A description will hereinafter be made about the individual steps of the management method.

First, a machining conditions recording step S10 is performed to record new machining conditions, which are to be used when machining a new type of wafer 1, in the information recording section 42b. Using the input interface, the operator of the machining system 2 records, in the information recording section 42b, the new machining conditions that are suited for machining the new type of wafer 1.

Next, an automatic machining program starting step S20 is performed. In the automatic machining program starting step S20, the operator inputs a command, which starts the automatic machining program, to the control unit 42 in a state that the cassette 28a with the new type of wafers 1 housed therein and the empty cassette 28b are mounted on the cassette mounting tables (in the cassette mounting regions) 26a and 26b, respectively. The machining system 2 is then caused to start the automatic machining program. Under the automatic machining program, one of the new types of wafers 1 is transferred by the transfer unit from the cassette 28 onto the chuck table 8 positioned in the wafer loading/unloading region. The new type of wafer 1 is then machined sequentially by the machining units 10*a* and 10*b* under the new machining conditions recorded in the machining conditions recording step (S10). Subsequently, the machined wafer 1 is positioned to the wafer loading/unloading region, is unloaded by the transfer unit from the chuck table 8, and is housed in the cassette 28*b*. Here, the machined wafer 1 may be housed back in the same cassette 28*a* in which the wafer 1 was held before the machining.

After the automatic machining program starting step S20, an imaging step S30 is performed to form an image, in which the pattern of the new type of wafer 1 is contained, by the camera unit 40 or 46. The imaging step S30 is performed in a course that, based on the automatic machining program, the transfer unit transfers the new type of wafer 1 from the cassette 28*a* onto the chuck table 8 positioned in the wafer loading/unloading region and the chuck table 8 holds the new type of wafer 1. The imaging of the wafer 1 may preferably be performed, for example, by the camera 40 when the wafer 1 has been transferred onto the chuck table 8 positioned in the wafer loading/unloading region. FIG. 3A is the cross-sectional view schematically illustrating the wafer 1 that is being imaged in the imaging step S30.

On the chuck table 8, the side of the back surface 1*b*, which is the to-be-machined surface of the wafer 1, is exposed upward, and faces the camera unit 40. In this state, the side of the front surface 1*a* of the wafer 1, on which the pattern is formed, cannot be imaged accordingly. Therefore, the camera unit 40 forms an image by detecting light of a wavelength that transmits the wafer 1. For example, the camera unit 40 includes an infrared camera and forms an image by capturing an infrared ray transmitted back through the wafer 1.

As an alternative, the imaging of the wafer 1 may also be performed by the camera unit 46 while the wafer 1 is transferred by the wafer transfer mechanism 34 from the positioning table 32 onto the chuck table 8 positioned in the wafer loading/unloading region. FIG. 3B is the cross-sectional view schematically illustrating the wafer 1 that is being imaged in the imaging step S30. The camera unit 46 faces the side of the front surface 1*a* of the wafer 1 and images the front surface 1*a* through the protective member 3 bonded to the wafer 1.

Next, a pattern recording step S40 is performed to record the pattern, which is contained in the image formed in the imaging step S30, in association with the new machining conditions, which have been recorded in the machining conditions recording step S10, in the information recording section 42*b*. FIG. 4 is a machining conditions table 48 schematically illustrating a concept of information recorded in the information recording section 42*b*. As illustrated in FIG. 4, in the information recording section 42*b*, plural kinds of machining conditions 52 are recorded corresponding to plural types 50 of wafers 1. In the information recording section 42*b*, patterns are also recorded in association with the individual kinds of machining conditions. In the example illustrated in FIG. 4, a kind of machining conditions 52 for machining wafers 1, the type 50 of which is "1," is indicated as "A," and a pattern 54*a* is associated with the kind "A" of the machining conditions 52. Similarly, a pattern 54*b* is associated with a kind "B" of machining conditions 52, and a pattern 54*c* is associated with a kind "C" of machining conditions 52.

FIG. 4 illustrates a case in which, when a kind "D" is recorded as the machining conditions 52 for the new type 50 of wafer 1 indicated by "4" in the machining conditions recording step (S10), a pattern 54*d* contained in the image acquired in the imaging step S30 is recorded in association with the kind "D" of machining conditions 52. Here, features which are preferably recorded as a pattern (key pattern) are those which have a characteristic shape such that they facilitate a determination by the determination section 42*a* among a variety of features formed on the front surface 1*a* of wafer 1 and contained in the image. The control unit 42 automatically determines a pattern, which is to be recorded, out of the features contained in the image. Alternatively, the acquired image may itself be recorded as a pattern in the information recording section 42*b*. In the machining system 2, the route along which each wafer 1 is transferred onto the chuck table 8 positioned in the wafer loading/unloading region is substantially unchanged. Especially along the transfer route of the wafer 1 after its position has been set by the positioning table 32, each wafer 1 passes at a same area thereof. When each wafer 1 is imaged by the camera 40 or 46, the same area in the front surface 1*a* is thus imaged. In other words, whatever pattern is recorded, the pattern can easily be searched for on the front surface 1*a* of the wafer 1. No problem hence arises despite the pattern is automatically determined and recorded.

Obviously, the operator may select a pattern to be recorded in the information recording section 42*b*. For example, the image acquired in the imaging step S30 may be displayed on the touch panel display 44, and from the image, the operator may then select a pattern to be recorded. It is desired for the operator to select a pattern having a characteristic inherent to the wafer 1.

When the pattern is recorded in association with the new machining conditions 52 in the pattern recording step S40, the determination section 42*a* can now determine, prior to next machining the wafer 1 unloaded from the cassette 28*a*, whether the wafer 1 is a wafer 1 as an object of machining.

In the machining system 2, after finishing the pattern recording step S40, a machining step S50 is performed to machine the new type of wafer 1, which has been used in recording the pattern, in accordance with the automatic machining program. In the machining step S50, the chuck table 8 with the wafer 1 held thereon is successively moved to the coarse grinding region and the finish grinding region, where the wafer 1 is machined by the machining units (grinding units) 10*a* and 10*b* based on the new machining conditions recorded in the machining conditions recording step S10.

Thereafter, an unloading step S60 is performed. In the unloading step S60, the machined wafer 1 is unloaded from the machining system 2. In the unloading step S60, the chuck table 8 that holds the wafer 1 machined by the machining units (grinding units) 10*a* and 10*b* is moved to the wafer loading/unloading region. The wafer 1 is then transferred by the wafer unloading mechanism (unloading arm) 36 to the spin rinser dryer 38, is rinsed by the spin rinser dryer 38, and is transferred by the wafer transfer robot 30 to the cassette 28*b*.

As appreciated from the foregoing, when recording the pattern in associating with the new machining conditions upon machining the new type of wafer 1 by the machining system 2, the management method according to this embodiment does not return the wafer 1 to the cassette 28*a* subsequent to its imaging by the camera unit 40 or 46. The automatic machining program is started, the wafer 1 is imaged on the side of the front surface 1*a* in the course of its transfer to the chuck table 8 for machining, and the selected pattern is then recorded. It is therefore unnecessary to start the automatic machining program after returning the wafer 1 to the cassette 28*a*. As a consequence, it is only necessary for the operator of the machining system 2 to simply start the automatic machining program after the new machining conditions are recorded in the information recording section 42*b*. Based on the automatic machining program, the pattern is then automatically recorded in association with the new machining conditions. Time and labor is thus saved in recording the pattern. Moreover, the automatic machining is continued until all the wafers 1 housed in the cassette 28*a* are machined.

In the management method according to this embodiment, when recording the pattern, which is formed on the front surface 1*a* of the wafer 1, in association with the new machining conditions, other information that can be used in the determination of the wafer 1 by the determination section 42*a* may be recorded in association with the new machining conditions in the information recording section 42*b*. Such other information is, for example, information on the protective member 3 bonded to the side of the front surface 1*a* of the wafer 1. On the side of the front surface 1*a* of the wafer 1, a protective member 3 of a proper type is bonded in conformity with the type of the wafer 1 and the new machining conditions for machining to be performed by the machining system 2. For example, proper selections are made on the materials and thicknesses of the base material layer and adhesive layer that make up the protective member 3. As the appearance of the protective member 3 differs with its type, it is possible to determine, from the appearance of the protective member 3 bonded to the wafer 1, whether a protective member 3 of a proper type is bonded.

If the wafer 1 is imaged on the side of the front surface 1*a* by the camera unit 46, for example, the front surface 1*a* is imaged through the protective member 3, so that information on the protective member 3 is contained in the image. For example, the image is affected by clarity and a color of the protective member 3. Further, sharpness of the front surface 1*a* of the wafer 1 contained in the image varies depending on the thickness of the protective member 3. Especially if a focus position of the camera unit 46 is moved such that it matches an exposed surface (a surface that is out of contact with the front surface 1*a*) of the protective member 3, the thickness of the protective member 3 can be calculated from a distance of movement of the focus position.

Further, if the front surface 1*a* is imaged by the camera unit 40 with an infrared camera included therein from the side of the back surface 1*b* through the wafer 1, the resulting image is also affected by the protective member 3 bonded to the front surface 1*a*. A color (spectrum) of an infrared ray detected by the camera unit 40 is significantly affected by the material of the protective member 3 which is primarily made of an organic resin or the like.

If the information on the protective member 3 bonded to the wafer 1 has been recorded in association with the new machining conditions in the information recording section 42*b*, the determination section 42*a* can determine, from the image acquired in the imaging step S30, whether the protective member 3 bonded to the wafer 1 is of the proper type. In the pattern recording step S40, the information on the protective member 3 may hence be additionally recorded in association with the new machining conditions when recording the pattern in association with the new machining conditions recorded in the information recording section 42*b* in the machining conditions recording step S10.

If the image with the front surface 1*a* of the wafer 1 contained therein is recorded in the information recording section 42*b* in the pattern recording step S40, for example, the image has been affected by the protective member 3, so that the information on the protective member 3 is recorded in association with the new machining conditions. When the front surface 1*a* of the wafer 1 subsequently loaded on the machining system 2 is imaged by the camera unit 40 or 46 and a determination is made by the determination section 46*a* as to whether the wafer 1 is proper (the properness/improperness of the wafer 1), reference is made to the information on the protective member 3 recorded in the information recording section 42*b*.

If a protective member 3 of an improper type is bonded, desired machining results cannot be obtained even if the wafer 1 is machined under the new machining conditions. Even if the pattern associated with the new machining conditions is detected on the front surface 1*a* of the wafer 1, the machining of the wafer 1 is stopped and the wafer 1 is unloaded by the transfer unit if the determination section 42*a* determines that the type of the protective member 3 is not proper. As a matter of fact, desired machining results cannot be obtained either if the protective member 3 is not bonded to the front surface 1*a* of the wafer 1. The control unit 42 also stops the machining of the wafer 1 and causes the transfer unit to unload the wafer 1 if the determination section 42*a* detects that the protective member 3 is not bonded. If the protective member 3 bonded to the wafer 1 is detected and the types of the wafer 1 and the protective member 3 are proper, on the other hand, the control unit 42 allows the machining units 10*a* and 10*b* to machine the wafer 1 without unloading it.

Figure 5B:
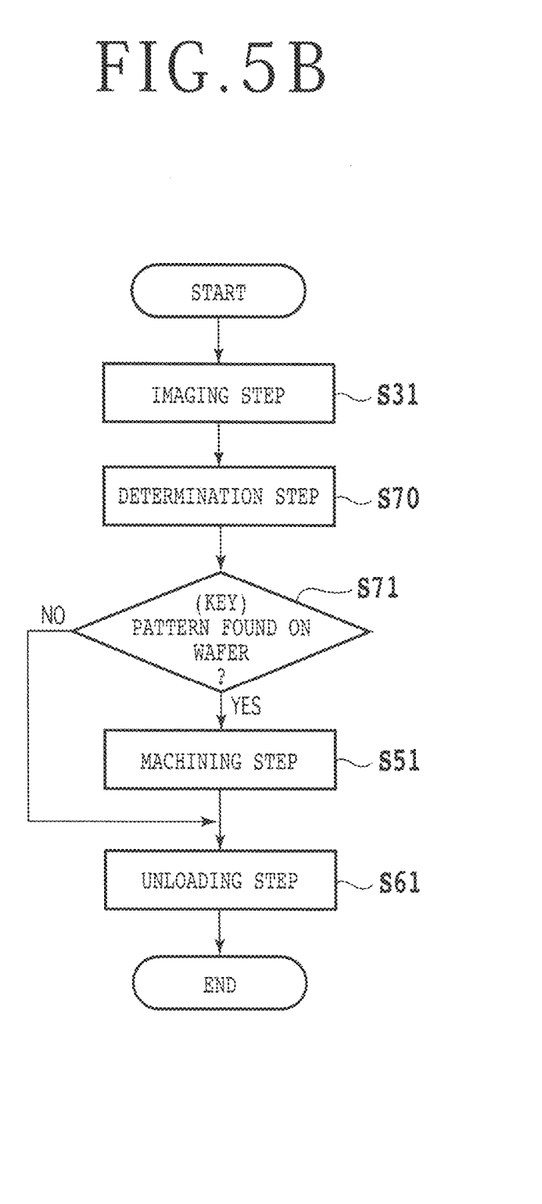
FIG. 5B is a flow chart schematically illustrating a flow of individual steps of a machining method of a wafer.

A description will next be made about a machining method of wafers 1, in which using the pattern recorded in association with the new machining conditions in the information recording section 42*b* by the above-described management method according to this embodiment, a determination is made as to whether the type of a succeeding wafer 1 is proper and, if proper, the wafers 1 are automatically machined. FIG. 5B is a flow chart illustrating a flow of individual steps of the machining method of the wafers 1.

When the above-mentioned automatic machining program is performed, the front surface 1*a* of the new type of wafer 1 unloaded first from the cassette 28*a* is imaged, and the new machining conditions and the pattern associated with the new machining conditions are recorded in the information recording section 42*b*. On the wafer 1 unloaded next from the cassette 28*a*, an imaging step S31 is then performed. In the imaging step S31, the wafer 1 in the cassette 28*a* is transferred by the wafer transfer robot 30 onto the positioning table 32, and the wafer 1 is positioned at the predetermined position by the positioning table 32. Subsequently, the wafer 1 is placed by the wafer transfer mechanism 34 onto the chuck table 8 positioned in the wafer loading/unloading region. In the course that the wafer 1 is unloaded from the cassette 28*a* and is then placed onto the chuck table 8, the wafer 1 is imaged on the side of the front surface 1*a* by the camera unit 40 or 46.

It is to be noted that the wafer 1 is housed in the cassette 28*a*, with the protective member 3 being bonded beforehand on the side of the front surface 1*a* and also with the side of the back surface 1*b* being directed upward beforehand. As an alternative, the wafer 1 may be housed in the cassette 28*a* with the side of the front surface 1*a* directed upward, and after having been turned upside down by the wafer transfer robot 30, may be transferred onto the positioning table 32.

A determination step S71 is next performed, in which the determination section 42a determines whether the pattern (key pattern), which has been recorded in the information recording section 42b in association with the machining conditions to be used when machining the wafer 1, is found in the front surface 1a of the wafer 1 contained in the image acquired in the imaging step S31. If the pattern is found in the image, the determination section 42a determines that the wafer 1 is an object of machining to be machined under the new machining conditions (S71). If the pattern is not found in the image, on the other hand, the determination section 42a determines that the wafer 1 is not an object of machining to be machined under the new machining conditions (S71).

If the wafer 1 is determined to be an object of machining to be machined under the new machining conditions, a machining step S51 is performed. In the machining step S51, the turn table 6 is rotated clockwise one third of a turn to move the chuck table 8 with the wafer 1 held thereon to the coarse grinding region. In the coarse grinding region, the wafer 1 is then machined (coarsely ground) by the machining unit 10a under the new machining conditions. Thereafter, the turn table 6 is rotated clockwise to move the chuck table 8 to the finish grinding region, and the wafer 1 is machined (subjected to finish grinding) by the machining unit 10b under the new machining conditions. Subsequently, the turn table 6 is turned clockwise to move the chuck table 8 to the wafer loading/unloading region. If in a determination step S70, the wafer 1 transferred onto the chuck table 8 is determined not to be an object of machining to be machined under the new machining conditions, on the other hand, the machining step S51 is not performed.

An unloading step S61 is next performed to transfer the machined wafer 1 from the chuck table 8 to the cassette 28b. Described specifically, the machined wafer 1 is transferred to the spin rinser dryer 38 by the wafer transfer mechanism 36, and is then transferred to the cassette 28b by the wafer transfer robot 30. If the machining step S51 has been performed and the wafer 1 has been machined, the machined wafer 1 is rinsed here by the spin rinser dryer 38. According to this machining method, machining can be performed after confirming that the wafer 1 loaded on the machining system 2 is a wafer 1 as an object of machining. The wafer 1 can therefore be machined under the proper machining conditions, so that desired machining results can be obtained. The automatic machining program is ended when all the wafers 1 housed in the cassette 28a have been unloaded from the machining system 2.

The present invention is not limited to the above description of the embodiment and can be practiced with various changes or alterations. In the above-described embodiment, the description is made about the case in which, when the information on the pattern, which the wafer 1 as an object of machining should include, and the information on the protective member 3 are recorded in the information recording section 42b, the imaging step S30 is performed on the wafer 1 unloaded first from the cassette 28a. However, the aspect of the present invention shall not be limited to such a case. Described specifically, the imaging step S30 may be performed on a wafer 1 unloaded as a second or subsequent object of machining from the cassette 28a, and in the pattern recording step S40, the pattern selected from the acquired image may be recorded in association with the machining conditions.

When an image is acquired by performing the imaging step S30 on a new type of wafer 1 unloaded first from the cassette 28a, for example, the determination section 42a may detect from the image that the protective member 3 is not bonded to the wafer 1. Further, it may also be found, for example, that the new type of wafer 1 is not an object of machining under the new machining conditions recorded in the information recording section 42b in the machining conditions recording step S10. In these cases, if the pattern recording step S40 is performed using the image containing the new type of wafer 1, no proper pattern is recorded in the information recording section 42b, and therefore the determination section 42a repeats a determination under an improper basis when determining whether subsequent wafers 1 are proper as objects of machining.

If any obvious problem is found on the new type of wafer 1 unloaded first from the cassette 28a, it is preferred to return the wafer 1 to the cassette 28a and then to unload another wafer 1 from the cassette 28a. Preferably, the imaging step S30 may then be performed on the other wafer 1 and the pattern recording step S40 may be performed using the resulting image.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A management method of a machining system including:
    a chuck table that has a holding surface on a top wall thereof and holds a wafer with a front surface of the wafer facing the holding surface,
    a machining unit that machines the wafer held on the chuck table, from a side of a back surface of the wafer,
    a transfer unit that unloads the wafer from a cassette housing the wafer therein, wherein the cassette is mounted in a cassette mounting region,
    a camera unit that images the wafer to acquire an image containing a pattern formed on a side of the front surface of the wafer,
    an information recording section that records the pattern contained in the image, in association with machining conditions to be used when machining the wafer by the machining unit, and
    a determination section that determines whether a second wafer that has been unloaded from the cassette and has not been machined yet, is an object of machining based on a detection of a pattern formed on the side of the front surface of the second wafer which is the same as the pattern recorded in association with the machining conditions in the information recording section,
    the management method, when recording the pattern in association with the machining conditions in the information recording section, comprising:
    a machining conditions recording step of recording, in the information recording section, new machining conditions to be used when machining a new type of wafer;
    an automatic machining program starting step of, after a new cassette with the new type of wafer housed therein is mounted in the cassette mounting region, causing the machining system to start an automatic machining program that transfers the new type of wafer from the new cassette onto the chuck table by the transfer unit;
    an imaging step of, after the automatic machining program starting step, forming an image containing a new pattern formed on a side of the front surface of the new type of wafer by the camera unit in a course that, based on the automatic machining program, the transfer unit transfers the new type of wafer from the new cassette onto the chuck table and the chuck table holds the new type of wafer;

a pattern recording step of, after the imaging step, recording, in the information recording section, the new pattern contained in the new image formed in the imaging step, in association with the new machining conditions recorded in the machining conditions recording step;

a machining step of, after the pattern recording, machining the new type of wafer by the machining unit under the new machining conditions recorded in the machining conditions recording step; and an unloading step of, after the machining step, unloading the new type of wafer from the chuck table by the transfer unit.

2. The management method according to claim 1, wherein:
the new type of wafer includes a protective member bonded to the side of the front surface thereof,
the camera unit has an infrared camera, and in the imaging step,
the new type of wafer is held on the chuck table via the protective member, and
the camera unit images the side of the front surface of the new type of wafer from the side of the back surface thereof.

3. The management method according to claim 2, wherein:
the determination section further has a function that determines existence/non-existence and properness/improperness of the protective member bonded to the side of the front surface of the new type of wafer that has not been machined yet, based on information about the protective member recorded in association with the new machining conditions in the information recording section and does not cause the machining unit to machine the new type of wafer that has not been machined yet, if the protective member is determined to be improper or if the protective member is determined not to be bonded to the new type of wafer that has not been machined yet, and
in the pattern recording step, the information about the protective member is extracted from the new image formed in the imaging step and is recorded in association with the new machining conditions in the information recording section.

4. The management method according to claim 1, wherein the camera unit that is disposed at a height which is below a height of the new type of wafer.

5. The management method according to claim 1, wherein the machining step is automatically performed after the pattern recording step, without a step of returning the new type of wafer to the new cassette prior to machining.

6. The management method according to claim 1, wherein the machining step is automatically performed after the imaging step, without a step of returning the new type of wafer to the new cassette prior to machining.

7. The management method according to claim 1, wherein the imaging step, the pattern recording step and the machining step are all automatically performed after the automatic machining program starting step, without a step of returning the new type of wafer to the new cassette prior to machining.

8. A management method of a machining system including:
a chuck table that has a holding surface on a top wall thereof and holds a wafer with a front surface of the wafer facing the holding surface, wherein the wafer includes a protective member bonded to the side of the front surface of the wafer,
a machining unit that machines the wafer held on the chuck table, from a side of a back surface of the wafer,
a transfer unit that unloads the wafer from a cassette housing the wafer therein, wherein the cassette is mounted in a cassette mounting region,
a camera unit that images the wafer to acquire an image containing a pattern formed on a side of the front surface of the wafer,
an information recording section that records the pattern contained in the image, in association with machining conditions to be used when machining the wafer by the machining unit, and
a determination section that determines whether a second wafer that has been unloaded from the cassette and has not been machined yet, is an object of machining based on a detection of a pattern formed on the side of the front surface of the second wafer which is the same as the pattern recorded in association with the machining conditions in the information recording section,
the management method, when recording the pattern in association with the machining conditions in the information recording section, comprising:
a machining conditions recording step of recording, in the information recording section, new machining conditions to be used when machining a new type of wafer;
an automatic machining program starting step of, after a new cassette with the new type of wafer housed therein is mounted in the cassette mounting region, causing the machining system to start an automatic machining program that transfers the new type of wafer from the new cassette onto the chuck table by the transfer unit;
an imaging step of, after the automatic machining program starting step, forming an image containing a new pattern formed on a side of the front surface of the new type of wafer by the camera unit in a course that, based on the automatic machining program, the transfer unit transfers the new type of wafer from the new cassette onto the chuck table and the chuck table holds the new type of wafer;
a pattern recording step of, after the imaging step, recording, in the information recording section, the new pattern contained in the new image formed in the imaging step, in association with the new machining conditions recorded in the machining conditions recording step, wherein information about the protective member is extracted from the new image formed in the imaging step and is recorded in association with the new machining conditions in the information recording section;
a machining step of, after the pattern recording step, machining the new type of wafer by the machining unit under the new machining conditions recorded in the machining conditions recording step; and
an unloading step of, after the machining step, unloading the new type of wafer from the chuck table by the transfer unit.

9. The management method according to claim 8, wherein:
the camera unit has an infrared camera, and in the imaging step,
the new type of wafer is held on the chuck table via the protective member, and the camera unit images the side of the front surface of the new type of wafer from the side of the back surface thereof.

10. The management method according to claim 8, wherein the camera unit that is disposed at a height which is below a height of the new type of wafer.

* * * * *